(12) United States Patent
Zhu et al.

(10) Patent No.: US 7,709,333 B2
(45) Date of Patent: *May 4, 2010

(54) METHOD FOR REDUCING OVERLAP CAPACITANCE IN FIELD EFFECT TRANSISTORS

(75) Inventors: Huilong Zhu, Poughkeepsie, NY (US); Oleg Gluschenkov, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/173,098

(22) Filed: Jul. 15, 2008

(65) Prior Publication Data
US 2008/0299732 A1     Dec. 4, 2008

Related U.S. Application Data

(60) Continuation of application No. 11/741,034, filed on Apr. 27, 2007, now Pat. No. 7,446,004, which is a division of application No. 11/161,447, filed on Aug. 3, 2005, now Pat. No. 7,253,482.

(51) Int. Cl.
*H01L 21/336* (2006.01)

(52) U.S. Cl. .................. 438/286; 438/305; 438/595; 438/700; 438/705; 257/E21.634; 257/E29.268; 257/E29.269

(58) Field of Classification Search ............... 438/231, 438/286, 303, 305, 595, 700, 705; 257/340, 257/386, 387, E29.268, E29.269, E21.634
See application file for complete search history.

(56) References Cited

U.S. PATENT DOCUMENTS

| 6,255,175 | B1 | 7/2001 | Yu | |
|---|---|---|---|---|
| 6,448,613 | B1 | 9/2002 | Yu | |
| 6,573,560 | B2 | 6/2003 | Shenoy | |
| 6,743,685 | B1 | 6/2004 | Wu et al. | |
| 6,870,220 | B2 | 3/2005 | Kocon et al. | |
| 7,161,199 | B2 | 1/2007 | Chen et al. | |
| 7,253,482 | B2 * | 8/2007 | Zhu et al. | 257/389 |
| 7,355,245 | B2 * | 4/2008 | Zhu et al. | 257/336 |
| 7,446,004 | B2 * | 11/2008 | Zhu et al. | 438/286 |
| 2003/0008484 | A1 * | 1/2003 | Hook | 438/524 |
| 2005/0035408 | A1 | 2/2005 | Wang et al. | |
| 2005/0116298 | A1 | 6/2005 | Tihanyi | |

FOREIGN PATENT DOCUMENTS

JP      4-208528     *    7/1992

* cited by examiner

*Primary Examiner*—M. Wilczewski
*Assistant Examiner*—Toniae M Thomas
(74) *Attorney, Agent, or Firm*—Cantor Colburn LLP; H. Daniel Schnurmann

(57) ABSTRACT

A field effect transistor (FET) device includes a gate conductor formed over a semiconductor substrate, a source region having a source extension that overlaps and extends under the gate conductor, and a drain region having a drain extension that overlaps and extends under the gate conductor only at selected locations along the width of the gate conductor.

6 Claims, 19 Drawing Sheets

METHOD FOR REDUCING OVERLAP CAPACITANCE IN FIELD EFFECT TRANSISTORS

CROSS REFERENCE TO RELATED APPLICATIONS

This application is a continuation application of U.S. Ser. No. 11/741,034, filed Apr. 27, 2007, now U.S. Pat. No. 7,446,004, issued Nov. 4, 2008, which is a divisional application of U.S. Ser. No. 11/161,447, filed Aug. 3, 2005, now U.S. Pat. No. 7,253,482, issued Aug. 7, 2007, the contents of which are incorporated by reference herein in their entirety.

BACKGROUND

The present invention relates generally to semiconductor device processing techniques, and, more particularly, to a structure and method for reducing overlap capacitance in field effect transistors (FETs).

In the manufacture of semiconductor devices, there is a constant drive to increase the operating speed of certain integrated circuit devices such as microprocessors, memory devices, and the like. This drive is fueled by consumer demand for computers and other electronic devices that operate at increasingly greater speeds. As a result of the demand for increased speed, there has been a continual reduction in the size of semiconductor devices, such as transistors. For example, in a device such as a field effect transistor (FET), device parameters such as channel length, junction depth and gate dielectric thickness, to name a few, all continue to be scaled downward.

Generally speaking, the smaller the channel length of the FET, the faster the transistor will operate. Moreover, by reducing the size and/or scale of the components of a typical transistor, there is also an increase in the density and number of the transistors that may be produced on a given amount of wafer real estate, thus lowering the overall cost per transistor as well as the cost of integrated circuit devices incorporating such transistors.

Unfortunately, reducing the channel length of a transistor also increases "short channel" effects, as well as "edge effects" that are relatively unimportant in long channel transistors. One example of a short channel effect includes, among other aspects, an increased drain to source leakage current when the transistor is supposed to be in the "off" or non-conductive state, due to an enlarged depletion region relative to the shorter channel length. In addition, one of the edge effects that may also adversely influence transistor performance is what is known as Miller capacitance. In CMOS applications, the Miller capacitance is an amplification of a gate to drain capacitance primarily dominated by a parasitic overlap capacitance ($C_{ov}$) component. Overlap capacitance exists primarily as a result of the doped polycrystalline silicon gate electrode and gate dielectric that (almost invariably) overlaps with a conductive portion of the more heavily doped source/drain regions and/or the less heavily doped source/drain extension (SDE) regions (if present) of the FET. The relative contribution of the overlap capacitance to the overall device capacitance increases as the gate length is scaled down. For example, $C_{ov}$ can account for as much as 50% of the overall capacitance when a MOSFET has a scaled gate length of about 30 nanometers.

Accordingly, it would be desirable to be able to fabricate an FET that maintains a low series resistance between the drain and the source of the device, while at the same time minimizing the parasitic Miller capacitance formed by the gate and drain/source overlap. In this manner, the RC delay may be reduced and/or device speed may be increased.

SUMMARY

The foregoing discussed drawbacks and deficiencies of the prior art are overcome or alleviated by a field effect transistor (FET) device including a gate conductor formed over a semiconductor substrate, a source region having a source extension that overlaps and extends under the gate conductor, and a drain region having a drain extension that overlaps and extends under the gate conductor only at selected locations along the width of the gate conductor.

In another embodiment, a method for forming a field effect transistor (FET) device includes forming a gate conductor over a semiconductor substrate, and forming a liner on sidewalls of the gate conductor, the liner formed at a greater thickness at selected portions of a drain side of the gate conductor than with respect to remaining portions of the drain side and with respect to a source side of the gate conductor. A source region is formed, the source region having a source extension that overlaps and extends under the gate conductor. A drain region is formed, the drain region having a drain extension that overlaps and extends under the gate conductor at locations along the width of the gate conductor not formed at the greater thickness.

In still another embodiment, a method for forming a field effect transistor (FET) device includes forming a gate conductor over a semiconductor substrate, and forming a source region, the source region having a source extension that overlaps and extends under the gate conductor. A drain region is formed, the drain region having a drain extension that overlaps and extends under the gate conductor at selected locations along the width of the gate, with the drain region further including a plurality of recessed areas corresponding to areas where the drain extension does not overlap and extend under the gate conductor.

BRIEF DESCRIPTION OF THE DRAWINGS

Referring to the exemplary drawings wherein like elements are numbered alike in the several Figures.

DETAILED DESCRIPTION

Disclosed herein is a method and structure for reducing Miller capacitance and short channel effects in field effect transistors (FETs), in which asymmetrical device characteristics are used to result in less charge sharing at the drain side of the device. Generally stated, an FET device is configured with a gate conductor formed over a semiconductor substrate, a source region having a source extension that overlaps and extends under the gate conductor, and a drain region having a drain extension that overlaps and extends under the gate conductor only at selected locations along the width of the gate conductor. By forming the device such that certain regions along the width of the device do not create a gate/drain overlap, the overall overlap capacitance is reduced with minimal impact on the device series resistance, since resistance in the device channel is dominated by the resistance component close to the source side of the channel. The net effect is the reduction of RC delay and/or enhancement of device performance.

In one embodiment, this configuration is realized by forming an oxide liner around the gate conductor such that the oxide liner has an increased thickness at specific locations on the drain side with respect to the remainder of the gate. The increase thickness of oxide liner at such locations prevents a drain extension/gate overlap that contributes to the parasitic capacitance. In another embodiment, this configuration is realized by forming a plurality of recessed areas in the drain side of the device prior to the extension and halo implants. As described in further detail hereinafter, this also has the effect of preventing a drain extension/gate overlap in the recessed areas.

Figure 1:
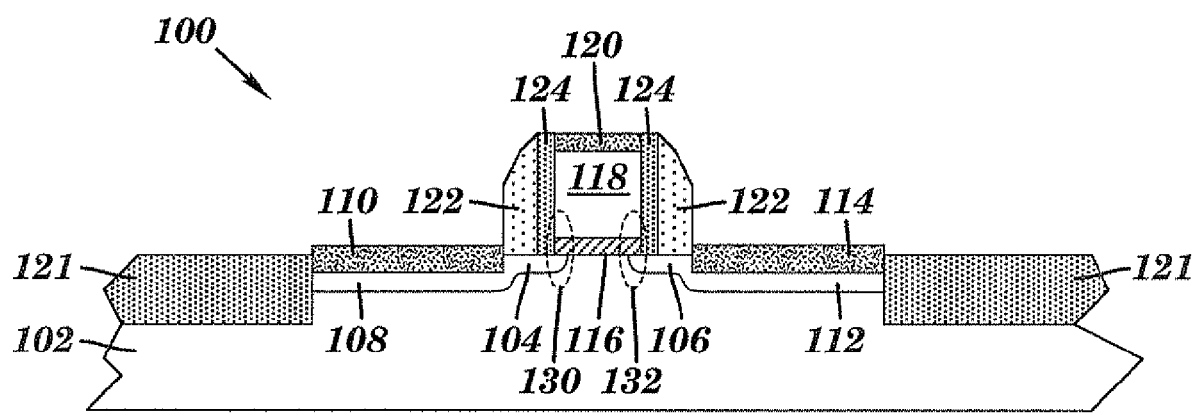
FIG. 1 is a cross sectional view of a conventionally formed MOS transistor illustrating the definition of a parasitic Miller capacitance.

Referring initially to FIG. 1, there is shown a cross sectional view of a conventional MOS transistor 100 formed on a semiconductor substrate 102 of, for example, any semiconductor material including, but not limited to: Si, SiC, SiGe, SiGeC, Ge alloys, GaAs, InAs, InP, as well as other III-V or II-VI compound semiconductors. The semiconductor substrate 102 may also comprise an organic semiconductor or a layered semiconductor such as Si/SiGe, a silicon-on-insulator (SOI) or a SiGe-on-insulator (SGOI). The scaled down MOSFET 100, having submicron or nanometer dimensions, includes a source extension 104 and a drain extension 106 formed within an active device area of the semiconductor substrate 102. The source extension 104 and the drain extension 106 are shallow doped junctions to minimize short channel effects in the MOSFET 100 having submicron or nanometer dimensions, as known to one of ordinary skill in the art of integrated circuit fabrication.

The MOSFET 100 further includes a source contact junction 108 with a source silicide 110 for providing contact to the source of the MOSFET 100 and includes a drain contact junction 112 with a drain silicide 114 for providing contact to the drain of the MOSFET 100. Both the source contact junction 108 and the drain contact junction 112 are fabricated as deeper junctions such that a relatively large size of the source silicide 110 and the drain silicide 114, respectively, may be fabricated therein to provide low resistance contact to the drain and the source of the MOSFET 100.

In addition, MOSFET 100 includes a gate dielectric 116 and a gate structure 118 formed thereon, which may be a polysilicon material, for example. As is the case with the source and drain regions, a gate silicide 120 is formed on the polysilicon gate 118 for providing low resistance contact to thereto. The MOSFET 100 is electrically isolated from other integrated circuit devices within the semiconductor substrate 102 by shallow trench isolation structures 121, which define the boundaries of the active device area of the semiconductor substrate 102. A spacer 122 is also disposed on the sidewalls of the polysilicon gate 118 and gate oxide 116. When, for example, the spacer 122 material includes silicon nitride ($Si_3N_4$), an insulating spacer liner oxide 124 is deposited as a buffer layer between the spacer 122 and the sidewalls of the polysilicon gate 118 and the gate oxide 116.

As will be noted from FIG. 1, a source overlap 130 is formed as a result of the source extension 104 extending under the gate structure 118. Correspondingly, a drain overlap 132 is formed as a result of the drain extension 106 extending under the gate structure 118. Although the source and drain overlaps 130, 132, are advantageous for lowering the respective series resistances between the drain 114 and source 110 of the MOSFET 100, the source overlap 130 is also disadvantageous because (as stated above) a parasitic Miller capacitance results between the gate and source of the MOSFET 100. Specifically, this capacitance is defined by the capacitance between the gate 118 and the source 110 that includes the overlap between the gate structure 118 and gate dielectric 116 with the source extension 104. Similarly, the drain overlap 132 is disadvantageous because a parasitic Miller capacitance results between the gate and drain of the MOSFET 100, that includes the overlap of the gate structure 118 and gate dielectric 116 over the drain extension 106.

While the dimensions of the MOSFET 100 (e.g., channel length) may further be scaled down to tens of nanometers, the source overlap 130 and the drain overlap 132 are typically not scaled down accordingly because a minimum amount of the source overlap 130 and the drain overlap 132 is desired for maintaining a relatively low series resistance between the drain and the source of the MOSFET 100. Unfortunately, as the dimensions of the MOSFET 100 are further scaled down and as the source overlap 130 and the drain overlap 132 are not scaled down accordingly, the parasitic Miller capacitance formed by the source overlap 130 and the drain overlap 132 becomes a predominant factor in degrading the device speed of the MOSFET 100.

Figure 2:
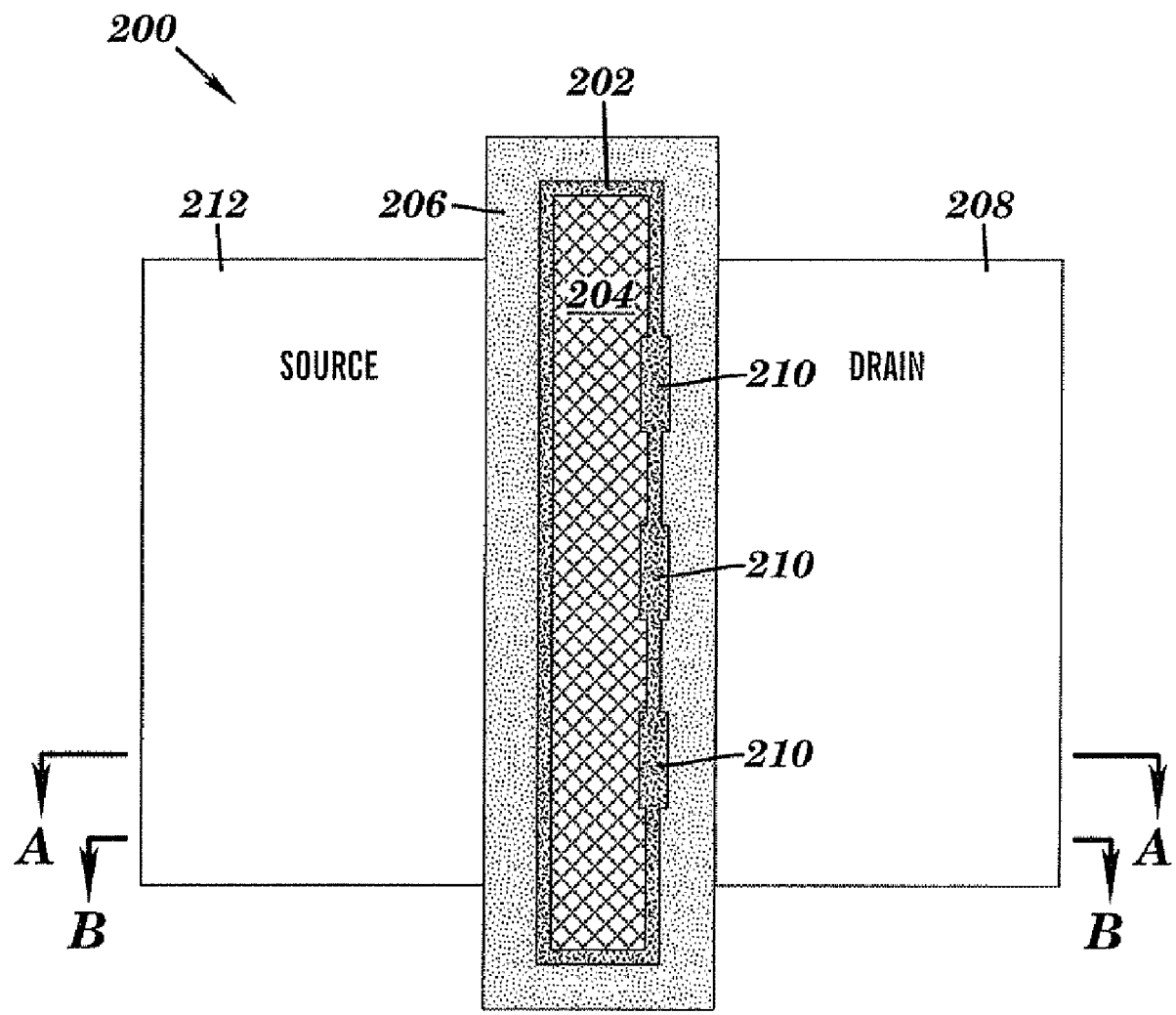
FIG. 2 is a top view of a MOSFET device having reduced Miller capacitance that also maintains a low gate and drain/source series resistance, in accordance with an embodiment of the invention.

Therefore, in accordance with an embodiment of the invention, FIG. 2 is a top view of a MOSFET device 200 having reduced Miller capacitance that also maintains a low gate/drain and gate/source series resistance. As will be noted in FIG. 2, the MOSFET 200 includes an oxide liner 202 between the gate conductor 204 and spacer material 206 (e.g., nitride). However, at selected locations along the sidewall of the gate 204 on the drain side 208 of the device, the oxide liner 202 includes thicker regions 210 with respect to the rest of the oxide liner 202 on the drain side 208, as well as with respect to the source side 212 of the device 200.

Figure 3A:
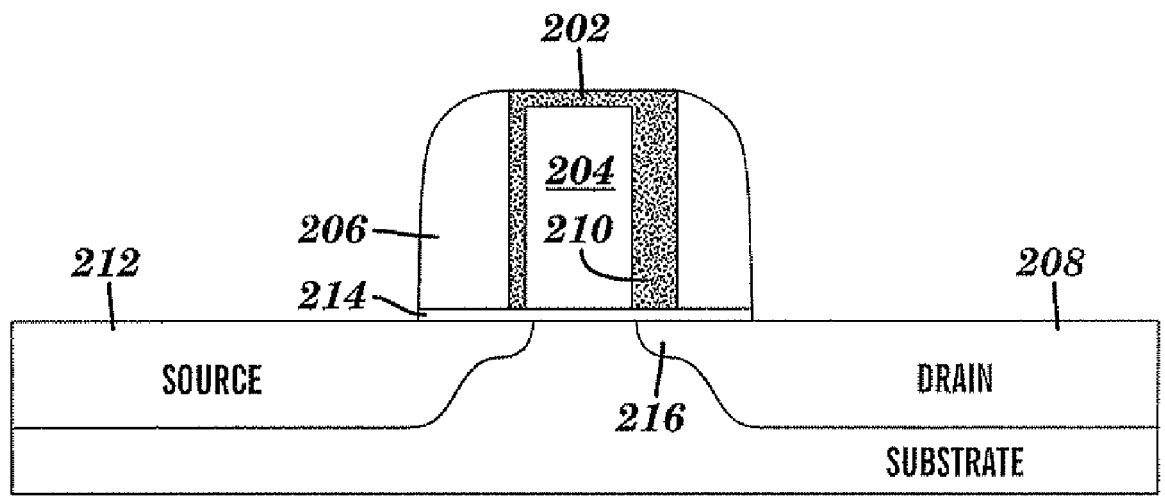
FIG. 3(a) is a cross sectional view of the MOSFET device of FIG. 2, taken along lines A-A in FIG. 2.
Figure 3B:
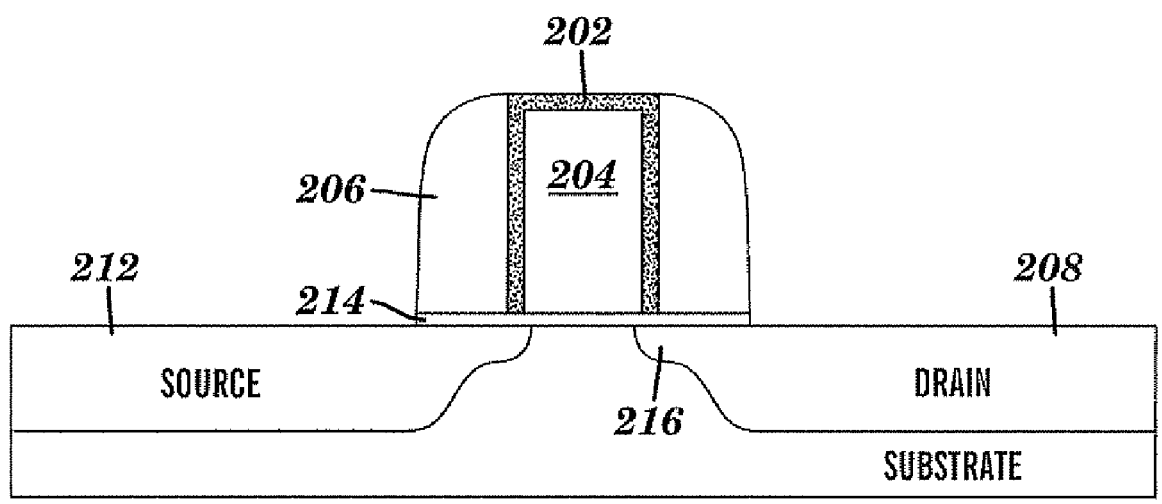
FIG. 3(b) is a cross sectional view of the MOSFET device of FIG. 2, taken along lines B-B in FIG. 2.

The function of the thicker oxide regions 210 on the drain side 208 of the gate 204 and gate oxide 214 is illustrated by a comparison between FIGS. 3(a) and 3(b). FIG. 3(a) is a cross sectional view of the MOSFET device 200, taken along lines A-A in FIG. 2, while FIG. 3(b) is a cross sectional view of the MOSFET device 200, taken along lines B-B in FIG. 2. As shown in FIG. 3(a), the thicker oxide region 210 is configured such that the drain extension 216 does not overlap the gate conductor 204 at this particular location along the width of the gate. As such, this portion of the drain side 208 of the device 200 does not contribute to the overall parasitic capacitance thereof. On the other hand, the series resistance of the device 200 at this location is slightly increased. Accordingly, only selected areas on the drain side 208 have the thicker oxide regions 210.

In contrast, FIG. 3(b) illustrates that in locations where the thicker oxide regions 210 are not present, an overlap between the gate conductor 204 and the drain extension 216 is still present. As will be appreciated, then, the number and width of the thicker oxide regions 210 may be selected to strike an appropriate balance between reducing Miller capacitance without substantially increasing the resistance between the drain and source. While the device 200 could also include such thicker oxide regions on the source side 212 of the gate 204, the resulting tradeoff would not likely be advantageous as the bulk of the overall series resistance lies in the drain to source series resistance.

Figure 4:
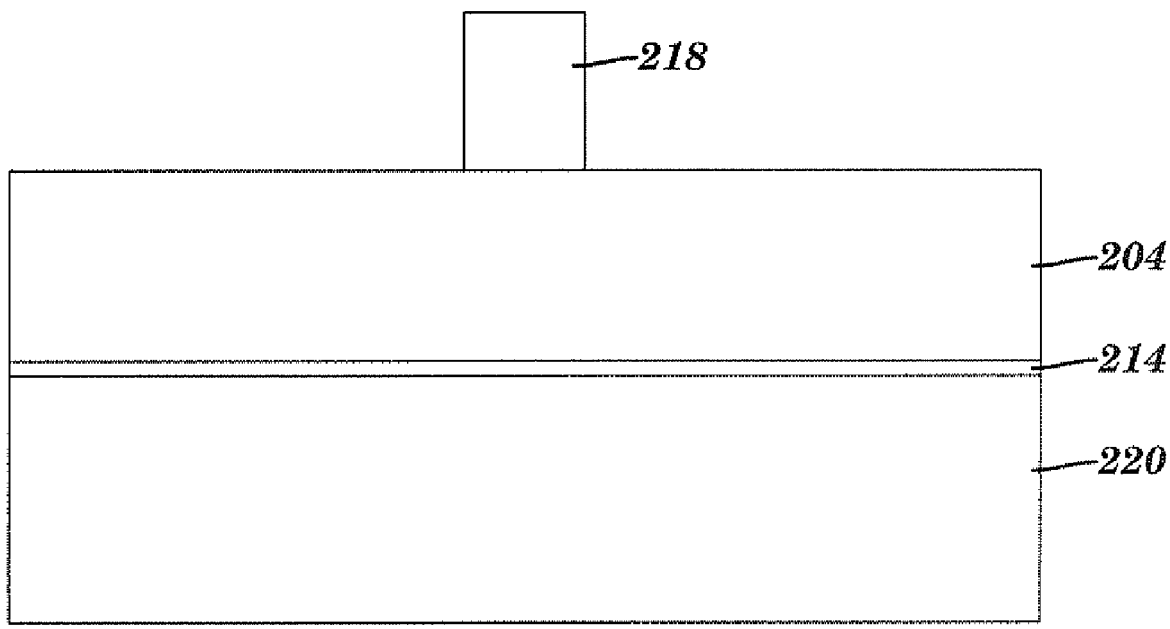
FIGS. 4-12 illustrate an exemplary process flow for forming the MOSFET device of FIG. 2.
Figure 5:
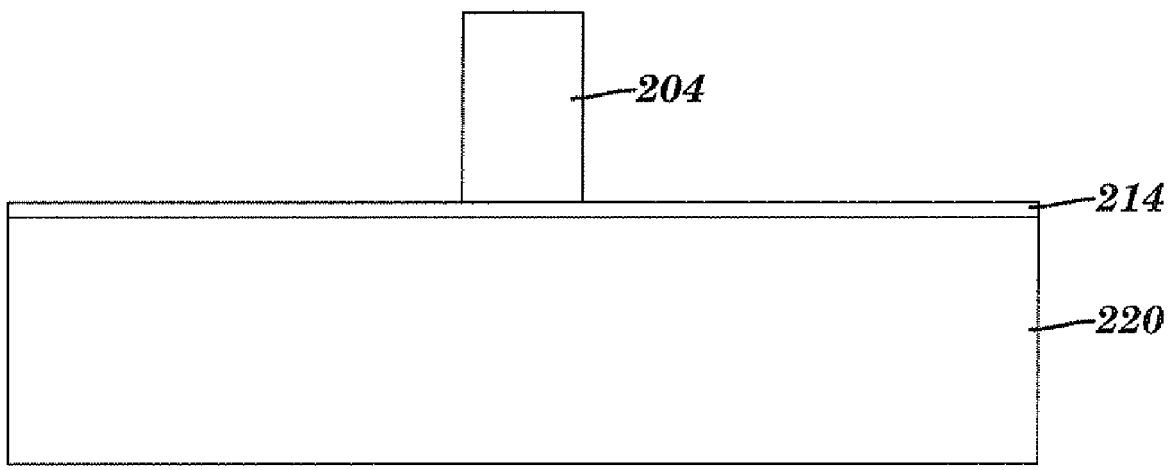
Figure 6:
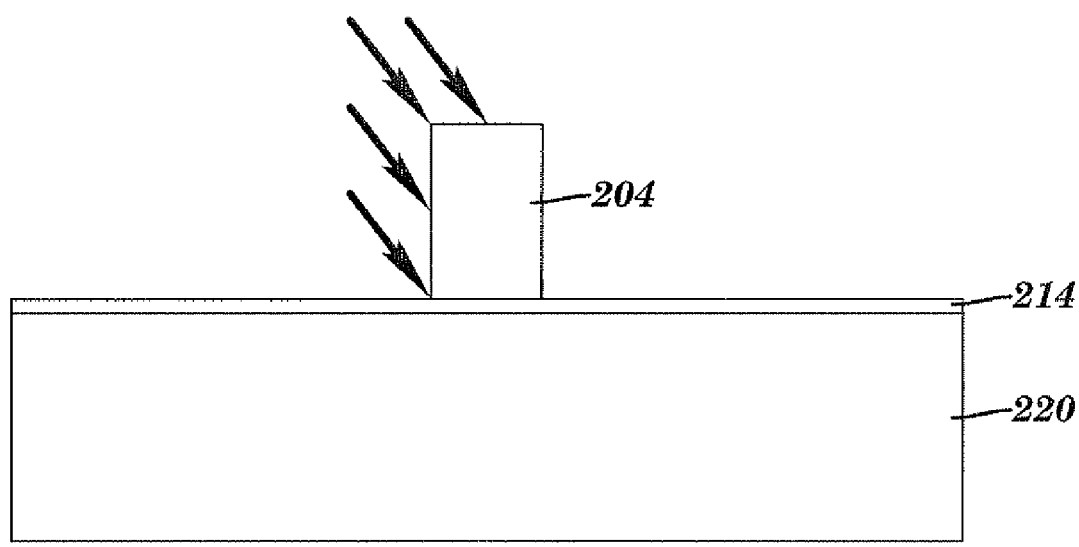

One exemplary process flow for implementing the device 200 described above is illustrated in FIGS. 4-12. In FIG. 4, a patterned photoresist layer 218 defines the shape of the gate to be patterned within the polysilicon gate layer 204, which is in turn formed on the gate oxide layer 214 over the substrate 220. The polysilicon gate etch and resist removal is shown in FIG. 5. Then, in FIG. 6, the source side of the gate 204 is subjected to an angled nitrogen implant in order to reduce the oxidation rate of the implanted portions of the polysilicon. The implant angle may be, for example, about 20 to about 45 degrees with respect to the normal of the substrate.

Figure 7:
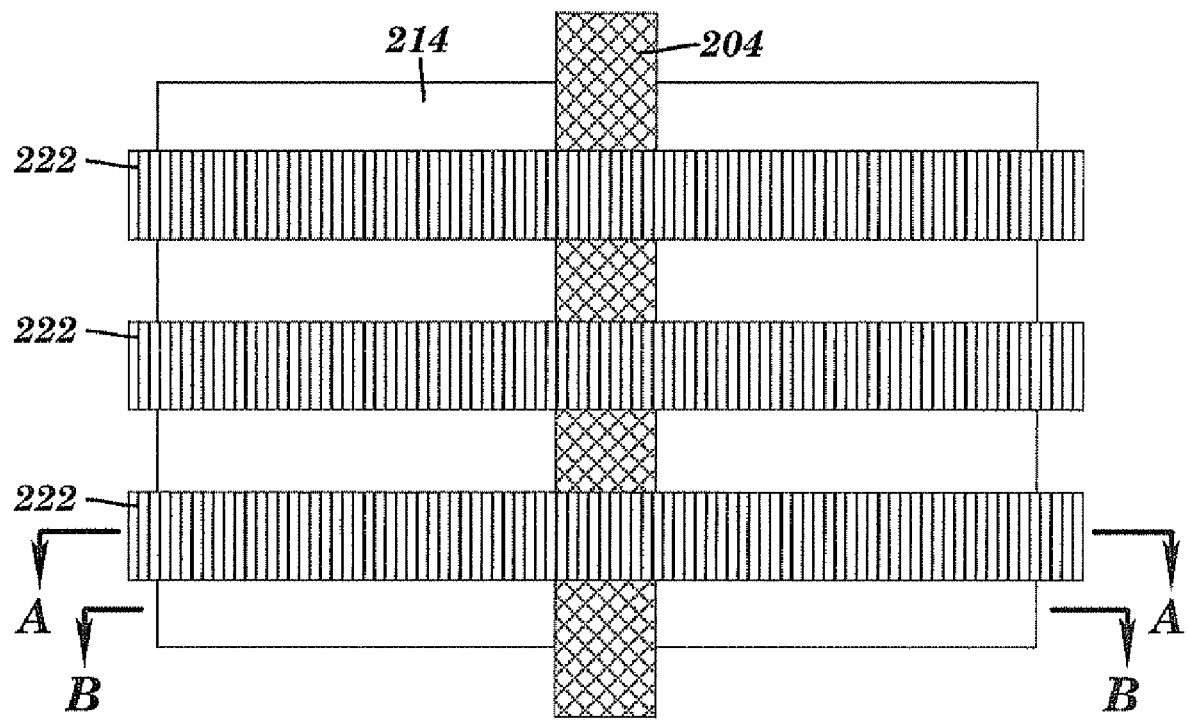
Figure 8A:
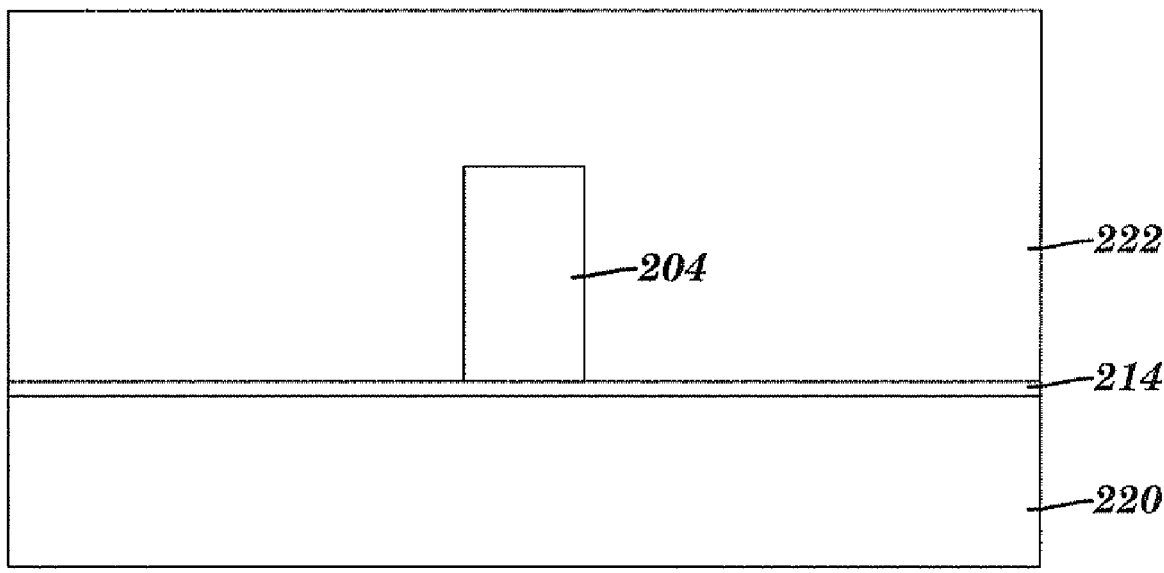
Figure 8B:
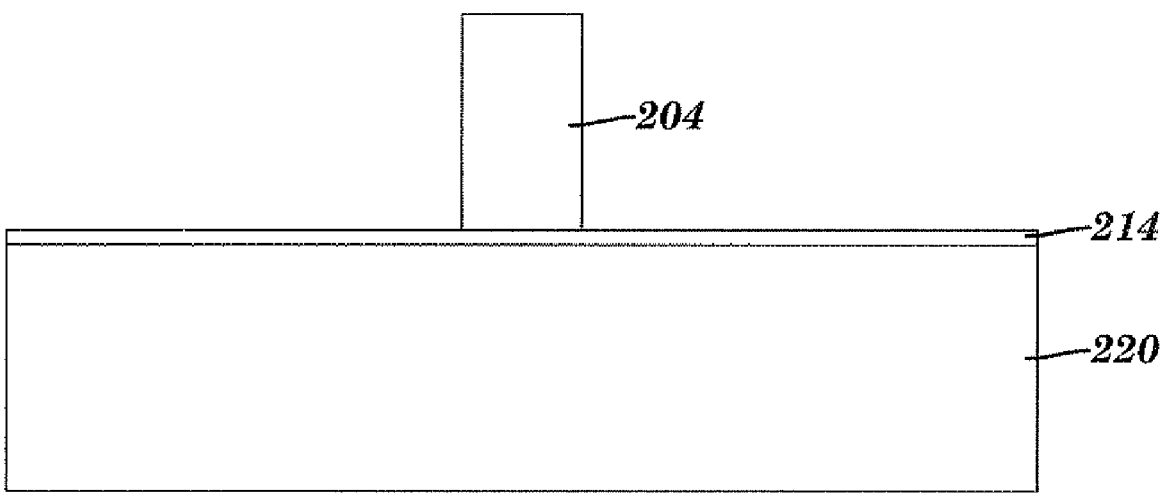
Figure 9A:
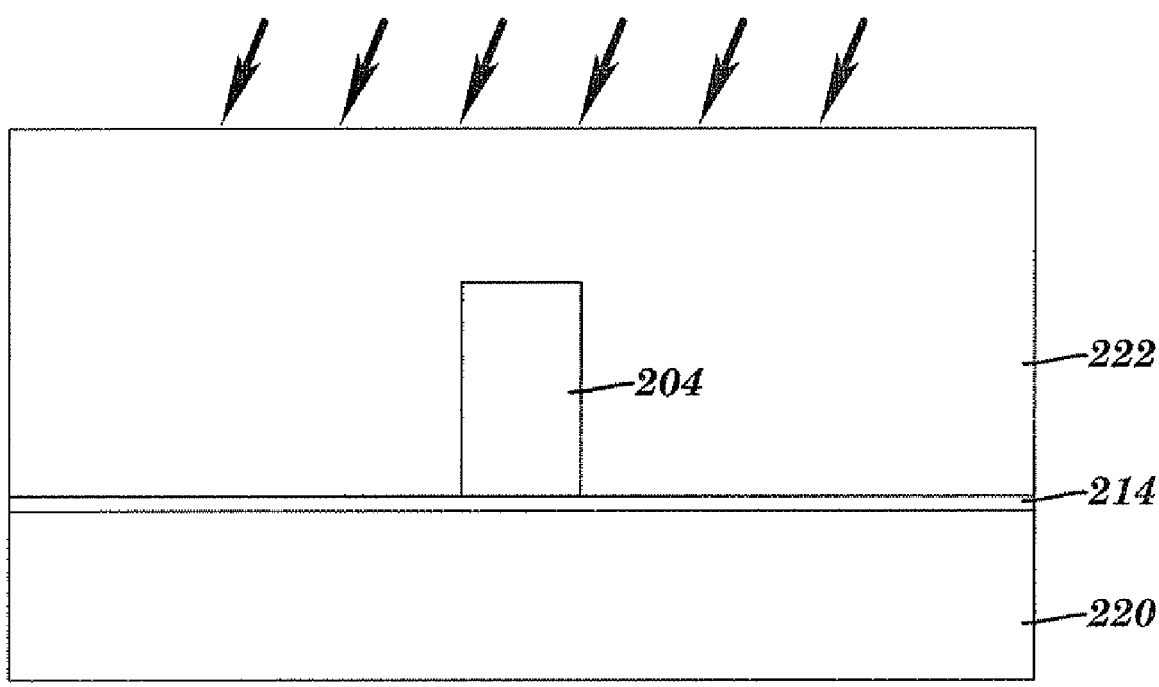
Figure 9B:
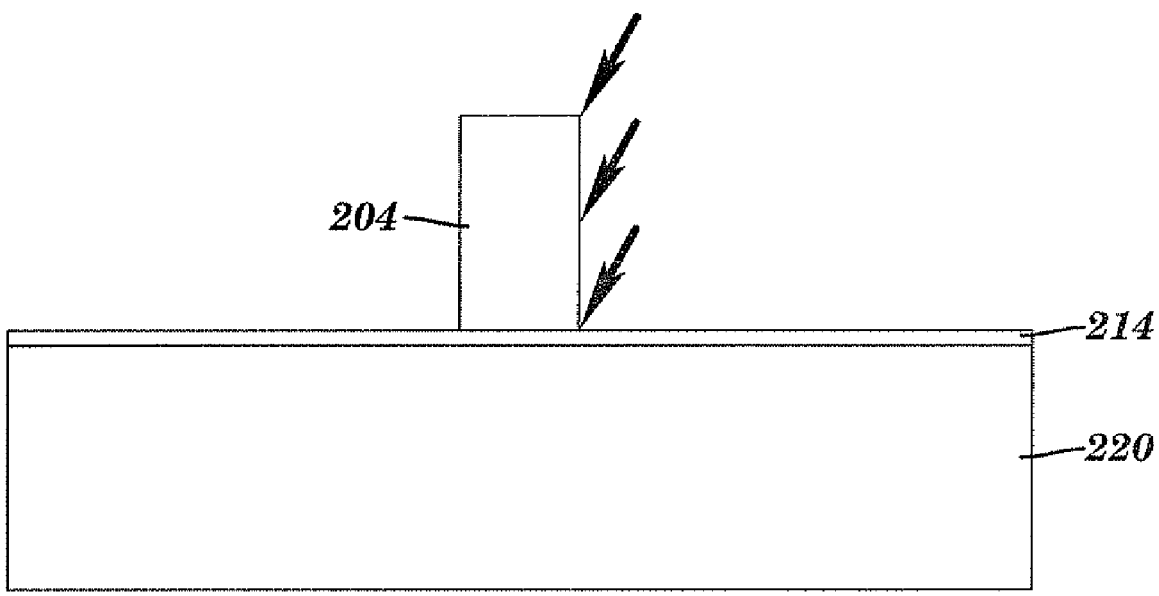

Referring to FIG. 7, a resist patterning step is then implemented as best illustrated in a top view. The patterned resist areas 222 serve to define locations on the drain side of the gate 204 on which the thicker oxide regions will be formed. In the sectional view of FIG. 8(a) taken along the lines A-A of FIG. 7, it can be seen that the patterned photoresist layer 222 covers the gate 204. In contrast, the sectional view of FIG. 8(b) taken along the lines B-B of FIG. 7 illustrates the lack of resist covering the gate 204. Another angled nitrogen implant is then implemented, this time directed toward the drain side of the gate 204. Because the implant is done with the presence of the patterned photoresist layer 222, portions of the drain side of the gate 204 will be protected from the implantation. In the sectional view of FIG. 9(a), the resist layer 222 prevents the nitrogen implant atoms from reaching the drain side of the gate 204 at that location. On the other hand, where the resist layer is not present, the angled implant will reduce the oxidation rate of the implanted portions of the drain side of the polysilicon gate 204, as shown in FIG. 9(b).

Figure 10:
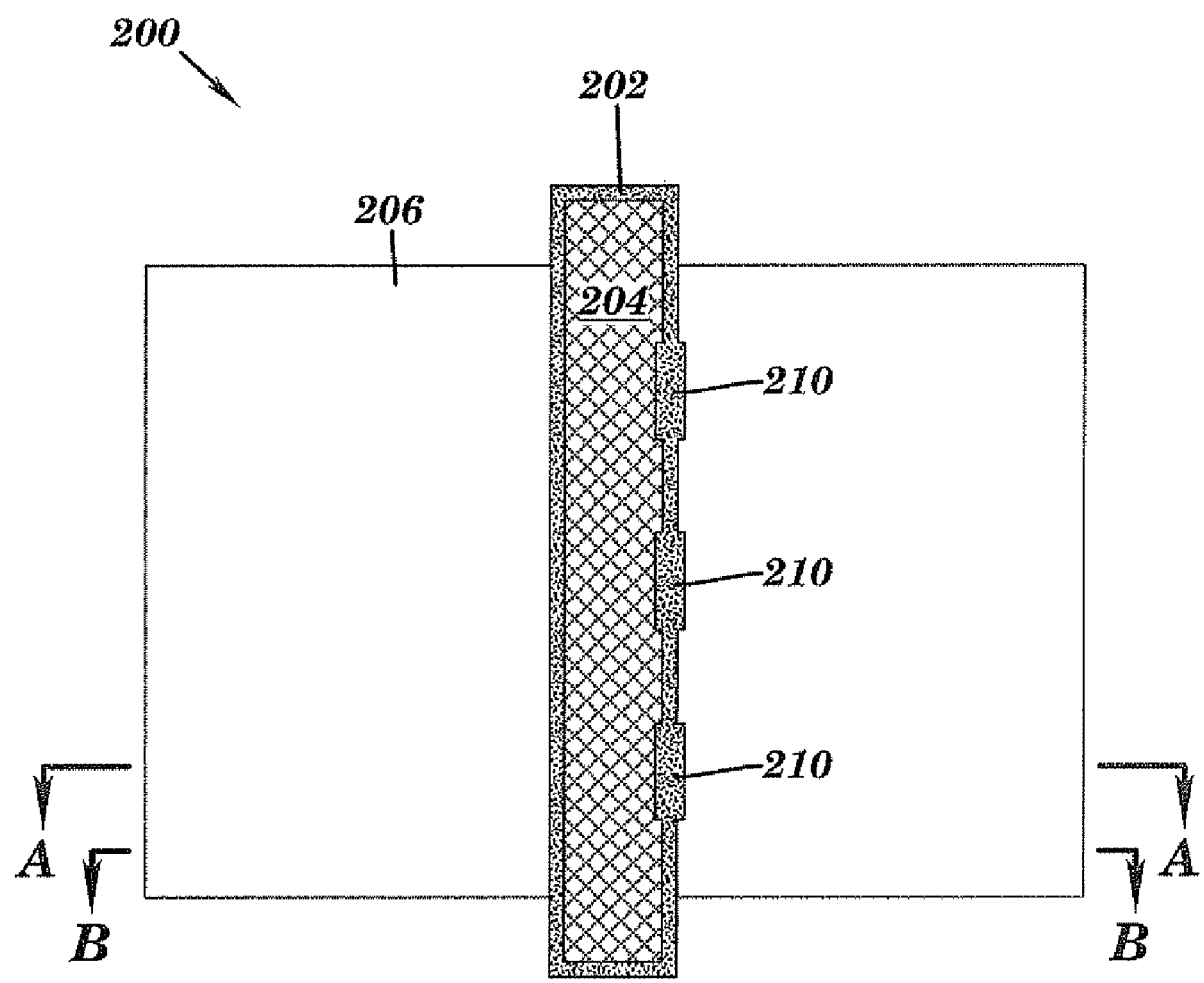
Figure 11A:
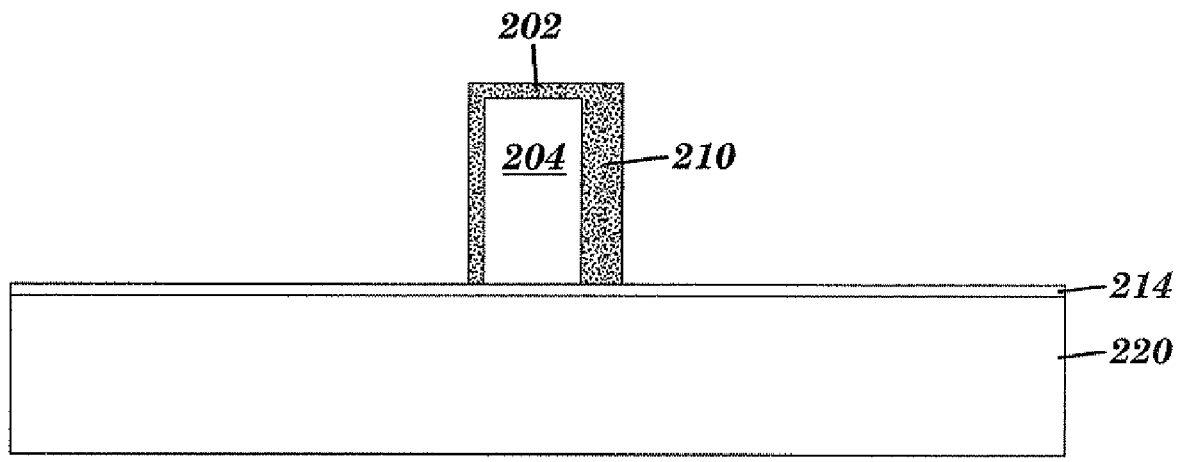
Figure 11B:
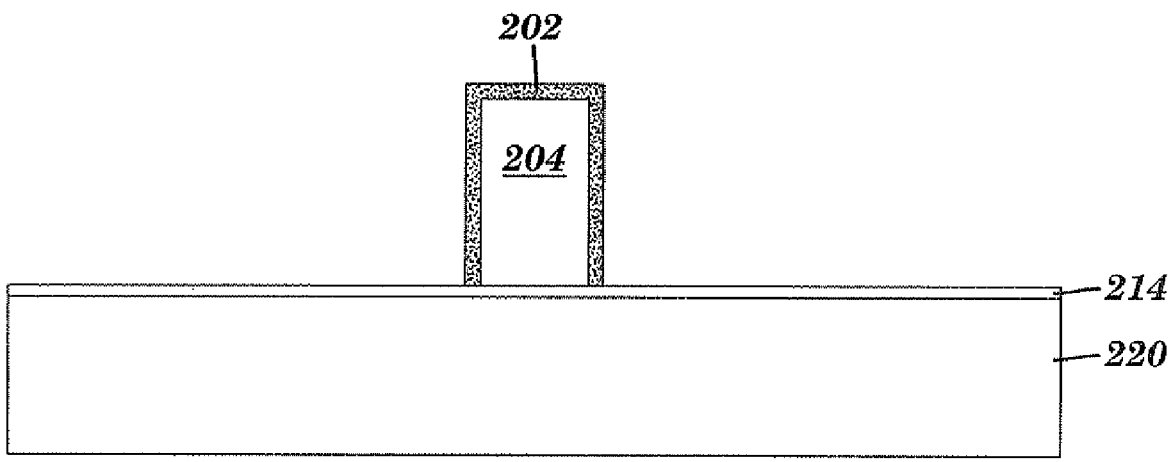

Proceeding to FIG. 10, a top view of the device 200 is shown following a thermal oxidation step. As is shown, the regions on the drain side of the gate 204 that were protected from the angled nitrogen implant are oxidized at a quicker rate than the implanted regions and, as such, the resulting oxide regions 210 are thicker than the remaining portions of the oxide liner 202. A comparison of the thicker oxide regions 210 formed on the drain side of the gate 204 is illustrated in FIGS. 11(a) and 11(b), wherein FIG. 11(a) is taken along the lines A-A of FIG. 10 and FIG. 11(b) is taken along the lines B-B of FIG. 10.

Figure 12A:
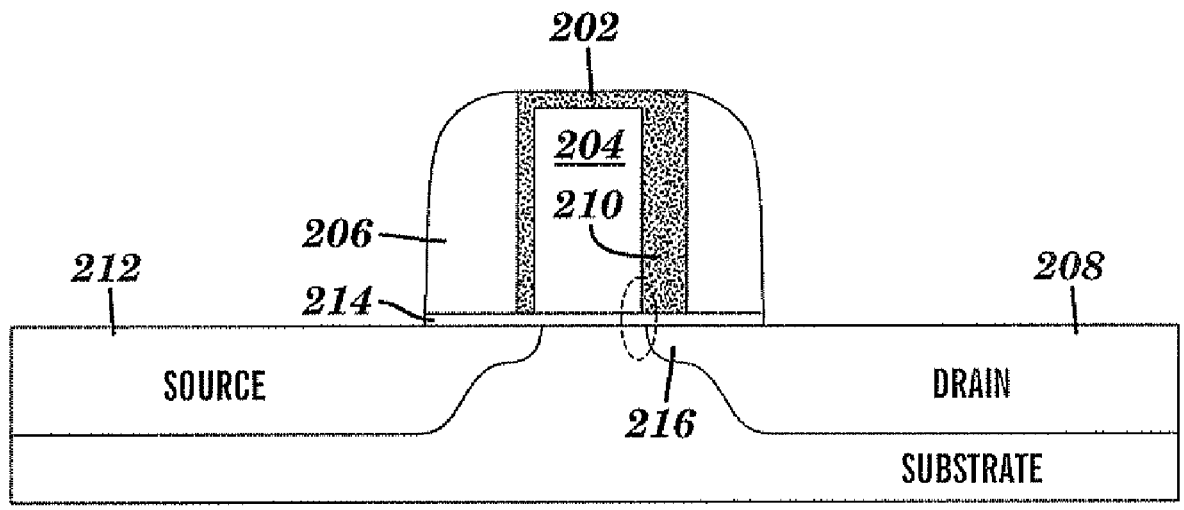
Figure 12B:
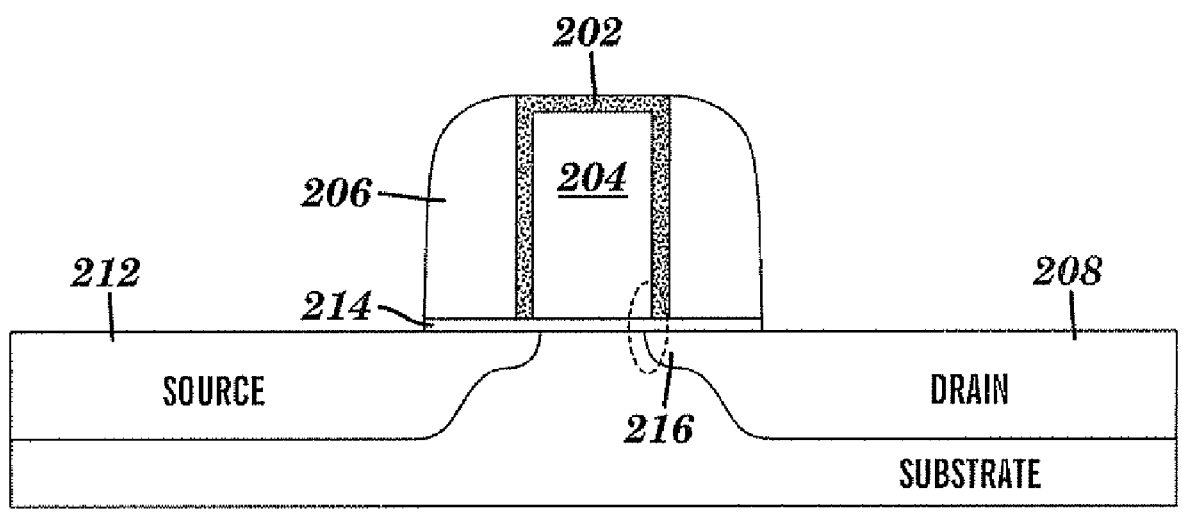

Finally, as shown in FIGS. 12(a) and 12(b), additional conventional processes are used to complete the definition of the MOSFET 200. First, source/drain extension and halo implants are introduced, followed by the formation of the spacers 206, followed by the source/drain ion implantation and diffusion anneal. As mentioned earlier, the thicker oxide regions 210, such as shown in FIG. 12(a) result in a lack of overlap between the drain extension region 216 and the gate conductor 204. Moreover, since the "on" current of the device 200 is dominated by the resistance in the source side of the channel, the lack of overlap of the drain extension region 216 in FIG. 12(a) does not provide a significant component in increasing the total resistance between source and drain or the switching time. This is due to the fact that there is still the overlap region shown in FIG. 12(b) to connect the drain to channel.

Figure 13:
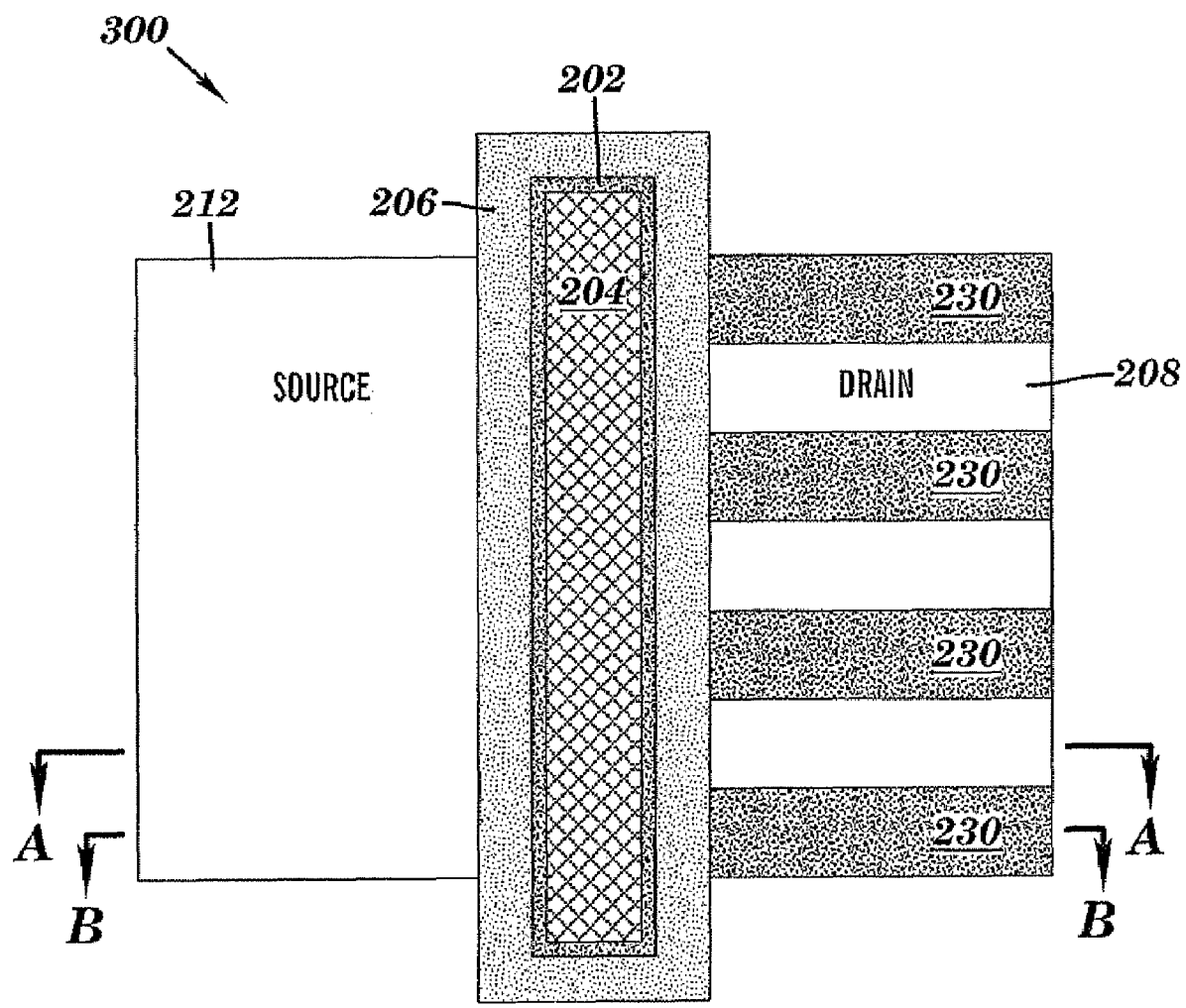
FIG. 13 is a top view of a MOSFET device having reduced Miller capacitance that also maintains a low gate and drain/source series resistance, in accordance with an alternative embodiment of the invention.

Referring now to FIG. 13, a top view of a MOSFET device 300 having reduced Miller capacitance that also maintains a low source to drain series resistance is illustrated in accordance with a further embodiment of the invention. In the present embodiment, the oxide liner 202 may be formed around the gate conductor 204 at a uniform thickness prior to forming the source/drain spacers 206. However, in order to provide both the reduced overlap capacitance and the desired short channel effects, a plurality of recessed areas 230 are defined along the width the drain side 208 of the device 300. Because the recessed areas 230 remove portions of the substrate containing extension and halo implants, the formation of an overlap capacitance is prevented at such locations.

Moreover, as is the case with the first embodiment, this drain side modification is not implemented along the entire width of the drain, but at selected intervals to obtain the best performance of the device. In this manner, the overlap capacitance is still reduced while the slight increase in resistance due to the reduction of overlap area between extension and inversion layer does not have a significant impact on the on-current of the device. Because the source side 212 of the gate 204 contributes to the bulk of the device series resistance, the recessed areas 230 are not formed therein. However, the principles of this embodiment could equally apply to the source side 212 if so desired.

Figure 14A:
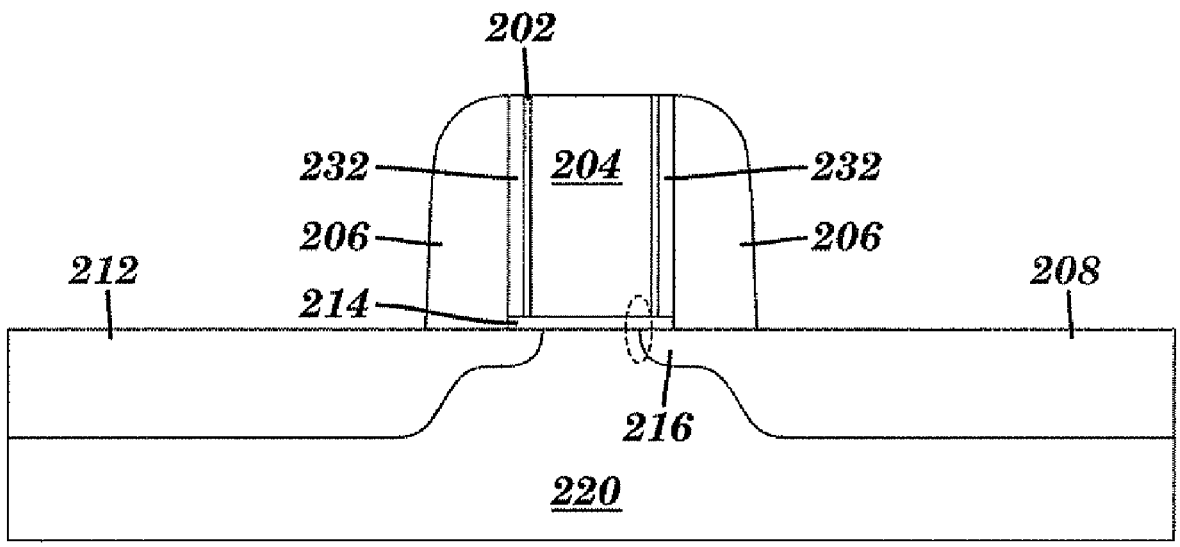
FIG. 14(a) is a cross sectional view of the MOSFET device of FIG. 13, taken along lines A-A in FIG. 13.
Figure 14B:
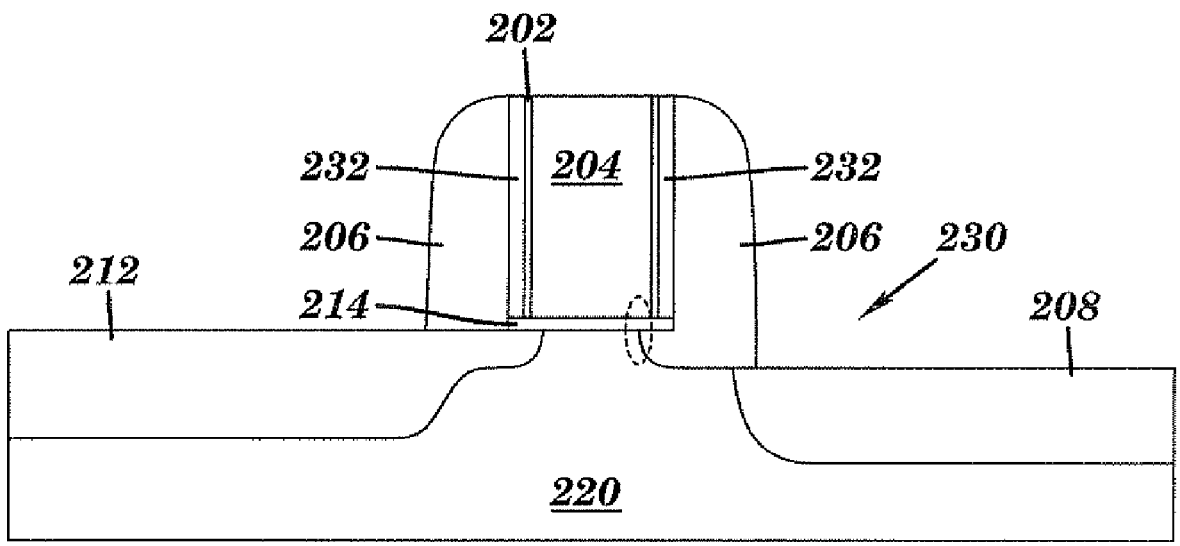
FIG. 14(b) is a cross sectional view of the MOSFET device of FIG. 13, taken along lines B-B in FIG. 13.

The function of the recessed areas 230 on the drain side 208 of the device is illustrated by a comparison between FIGS. 14(a) and 14(b). FIG. 14(a) is a cross sectional view of the MOSFET device 300, taken along lines A-A in FIG. 13, while FIG. 14(b) is a cross sectional view of the MOSFET device 300, taken along lines B-B in FIG. 13. As shown in FIG. 14(a), in locations where the recessed areas 230 are not present, an overlap between the gate conductor 204 and the drain extension 216 is still present, such as would be the case along the entire width of a conventional device. It will be further noted that FIG. 14(a) also illustrates a thin nitride spacer layer 232 between the oxide liner 202 and the nitride source drain spacers 206, as will be shown in further detail hereinafter.

In contrast, FIG. 14(b) illustrates a cross section along one of the recessed areas 230 on the drain side 208. As will be noted, there are no drain extension portions where the recessed areas are defined. Instead, this space that would otherwise include a drain extension region is instead occupied by the drain side nitride spacer 206. The diffusion region on the drain side 208 also sits at a lower level with respect to the diffusion region on the source side 212. The result is therefore an elimination of gate/drain overlap in these regions 230. Similar to the first embodiment, the number and width of the recessed areas 230 may be selected to strike an appropriate balance between reducing Miller capacitance without substantially increasing the source to drain resistance.

Figure 15:
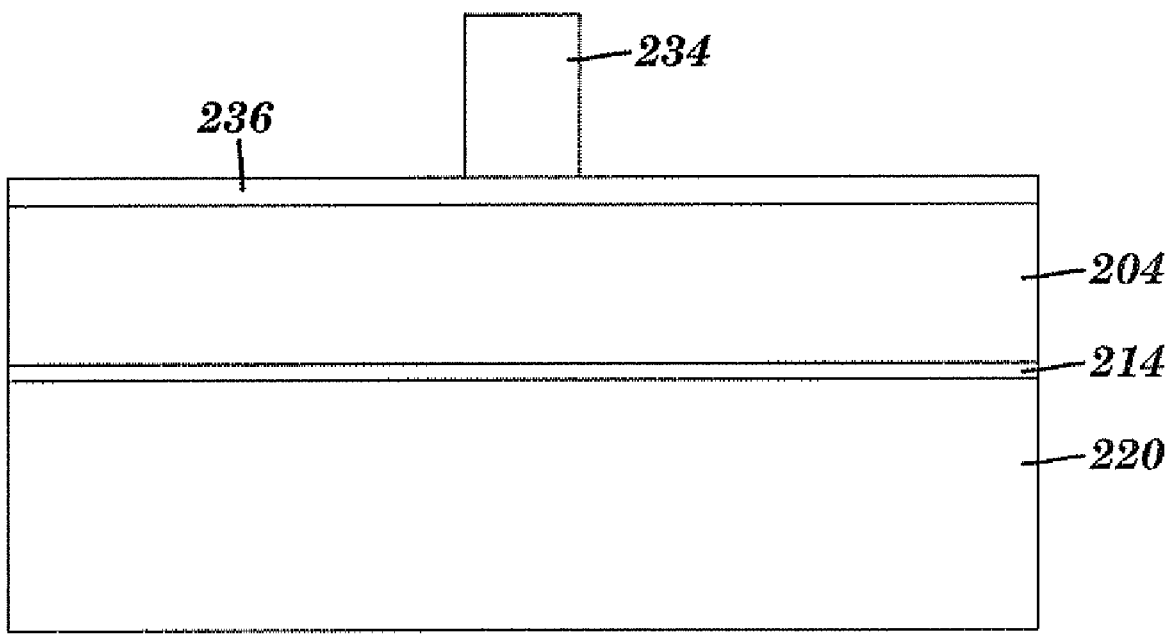
FIGS. 15-22 illustrate an exemplary process flow for forming the MOSFET device of FIG. 13.
Figure 16:
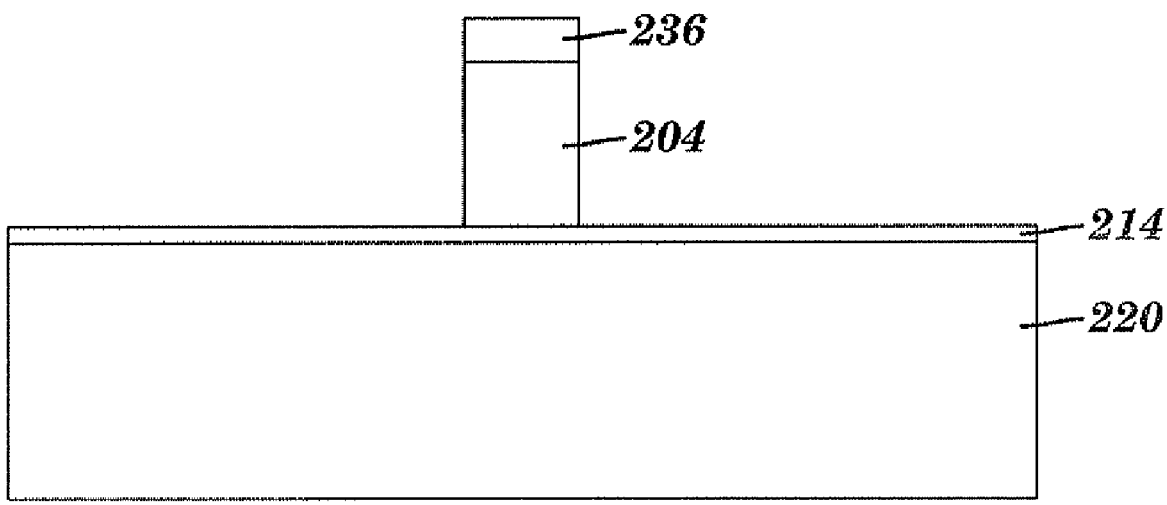
Figure 17:
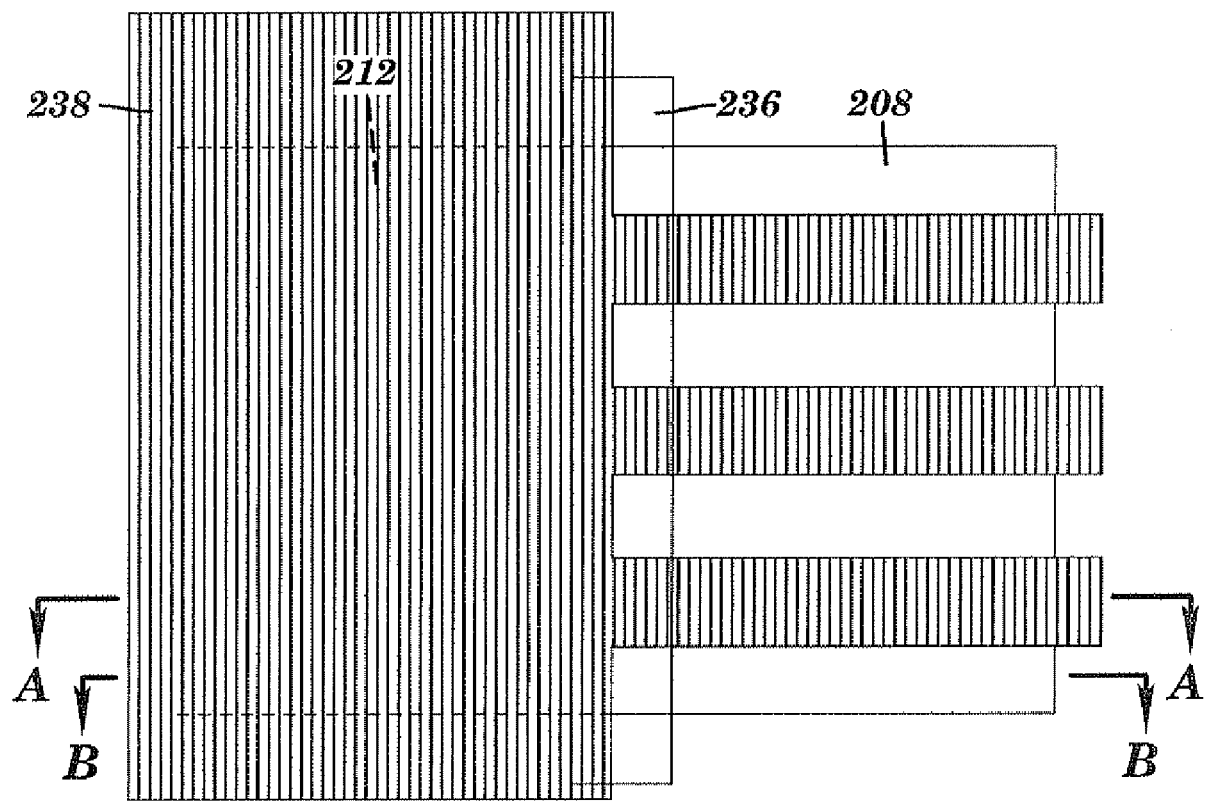

An exemplary process flow for implementing the device 300 described above is illustrated in FIGS. 15-22. In FIG. 15, a patterned photoresist layer 234 defines the shape of the gate to be patterned within the polysilicon gate layer 204, which is in turn formed on the gate oxide layer 214 over the substrate 220. As also illustrated, a nitride capping layer 236 is also formed over the polysilicon gate layer 204. The polysilicon gate etch and resist removal is shown in FIG. 16, wherein a protective nitride cap 236 is also defined during the gate etch. Then, in FIG. 17, another patterned photoresist layer 238 is formed over the device to define the portions of the drain side 208 to be recessed.

Figure 18A:
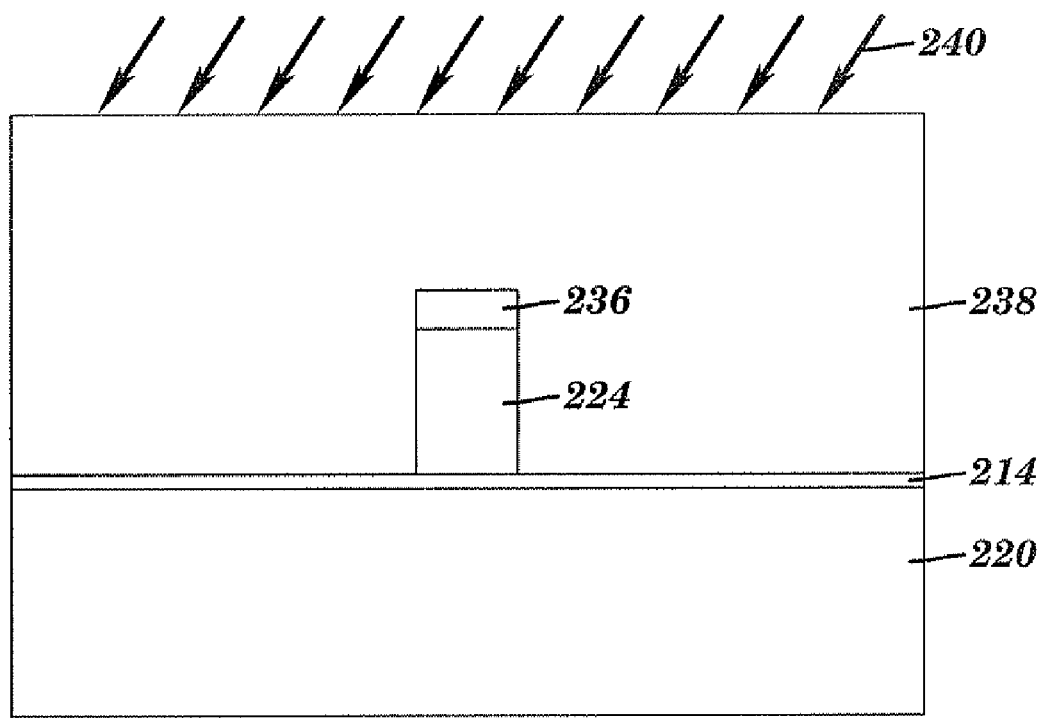
Figure 18B:
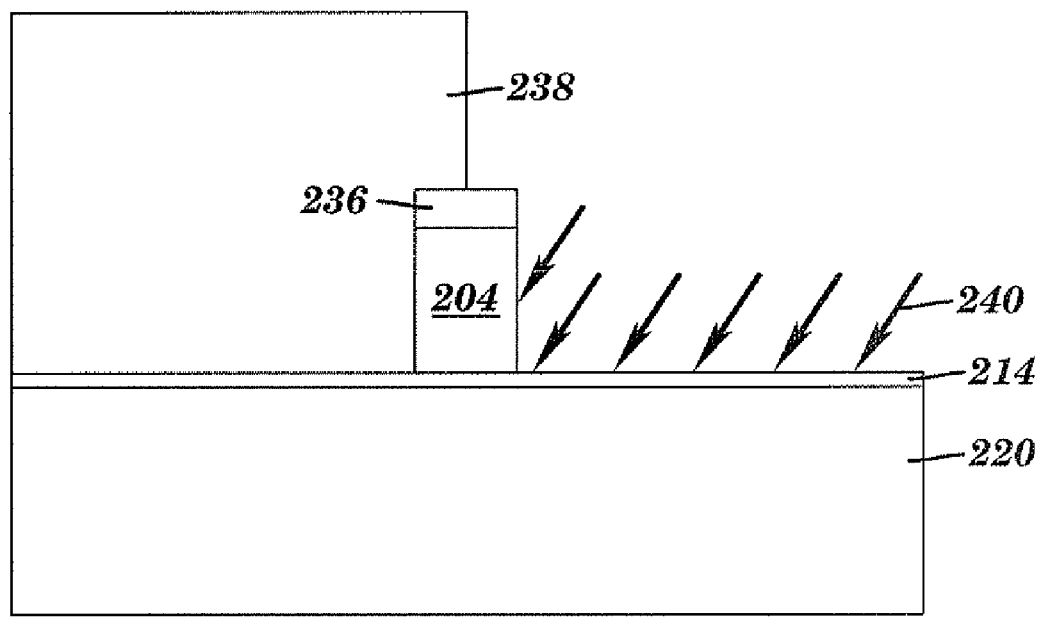

More specifically, the resist pattern 238 covers the entire source side of the device and portions of the drain side of the device. The portions of the drain side of the device not covered by the resist are subjected to an angled neutral dopant (e.g., germanium, indicated by arrows 240) implant in order to increase the etch rate of these area with respect to the undoped silicon. The neutral dopant implant is illustrated in the cross sectional views of FIGS. 18(*a*) and 18(*b*). In FIG. 18(*a*), taken along lines A-A of FIG. 17, the resist layer 238 covers both the source and drain sides, and thus the germanium dopant does not reach the substrate layer 220. On the other hand, in FIG. 18(*b*), taken along lines B-B of FIG. 17, the germanium dopant is implanted into the exposed substrate (through gate oxide layer 214) on the drain side of the device, including beneath the gate conductor 204 where a halo extension would ordinarily be formed.

Figure 19A:
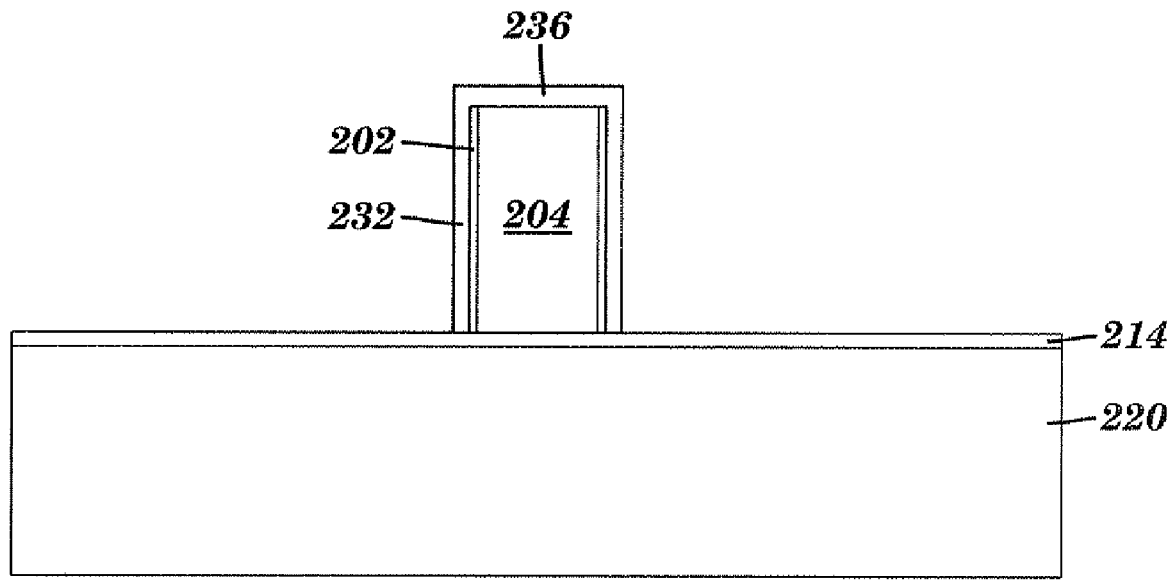
Figure 19B:
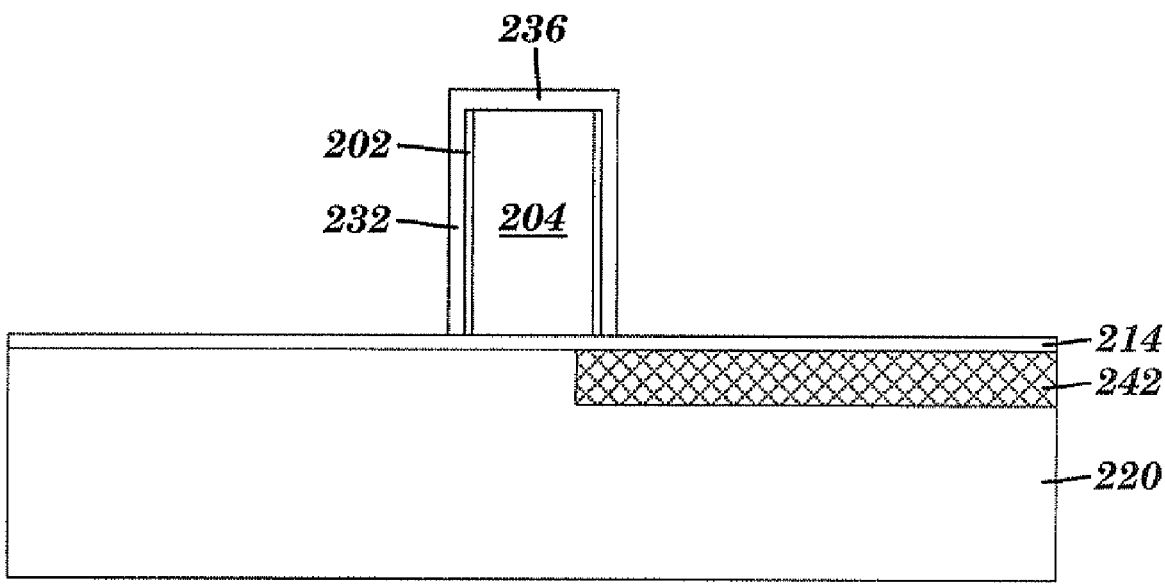

Upon removal of the photoresist layer 238, the oxide collar 202 is formed on the sidewalls of the gate, followed by the thin nitride spacer 232 described earlier, as shown in FIGS. 19(*a*) and 19(*b*). In FIG. 19(*b*), the resulting germanium doped area 242 is shown on the drain side of the device. Then, extension and halo implants are formed in the device, in accordance with existing MOSFET formation techniques. The gate oxide layer 214 is removed (e.g., by reactive ion etching) except for beneath the gate 204 and thin spacers 232. This exposes the silicon substrate 220 and those portions of the substrate doped by germanium to an etch process that has a high selectivity of SiGe with respect to Si.

Figure 20A:
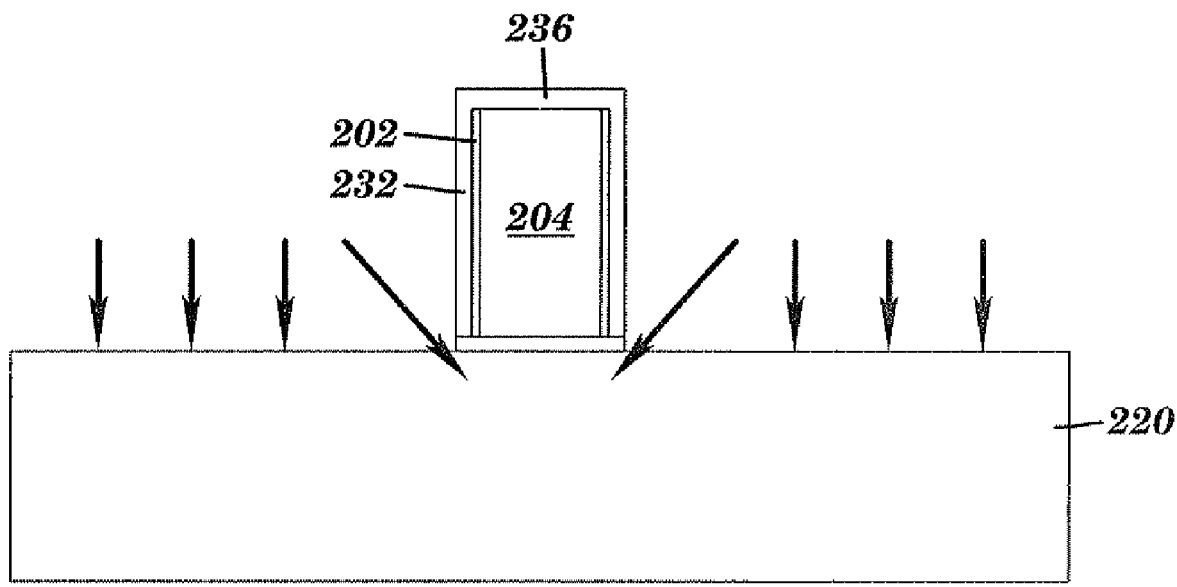
Figure 20B:
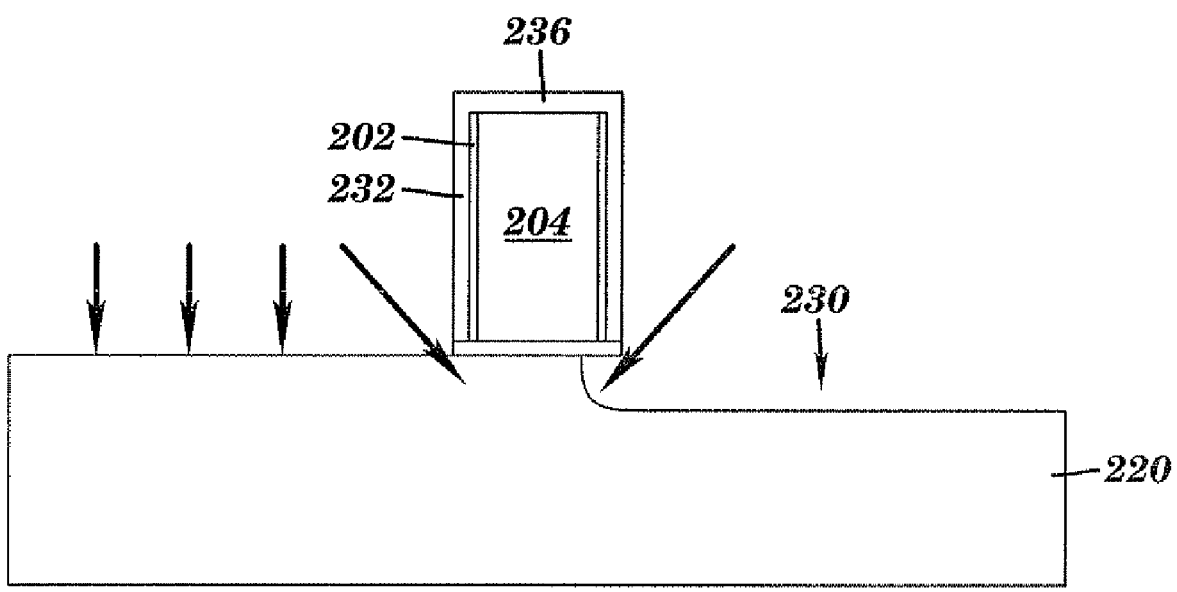
Figure 21A:
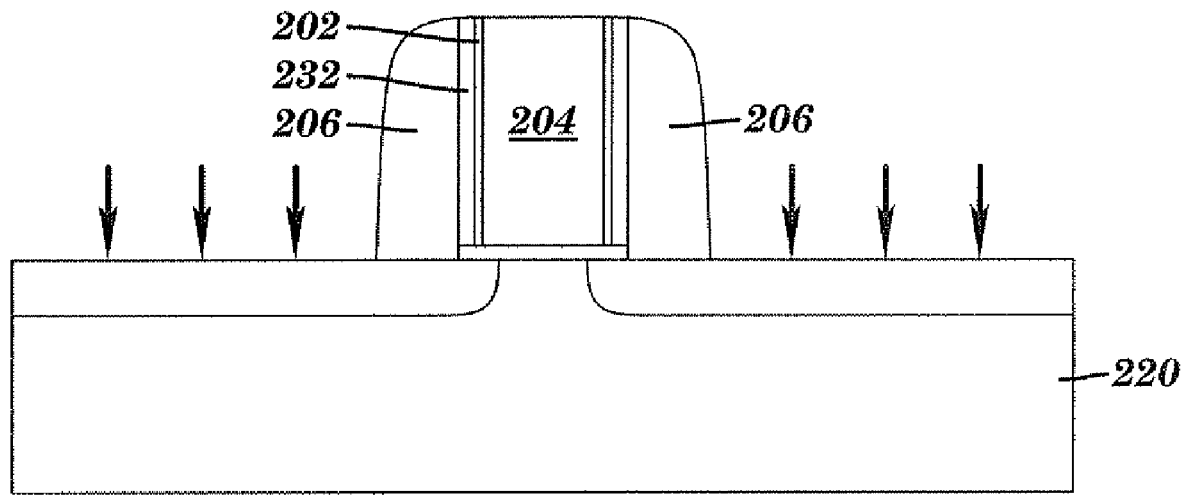
Figure 21B:
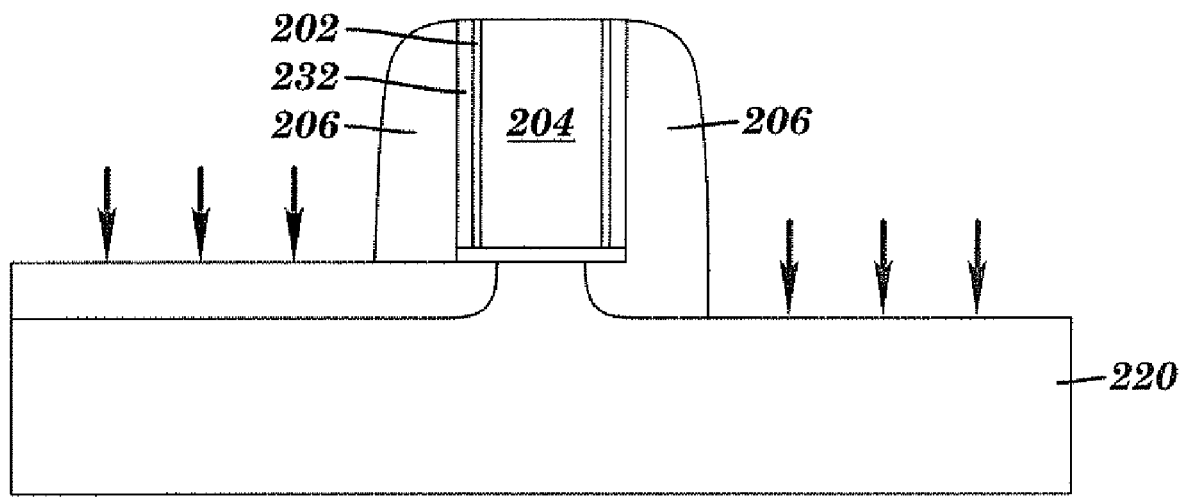
Figure 22A:
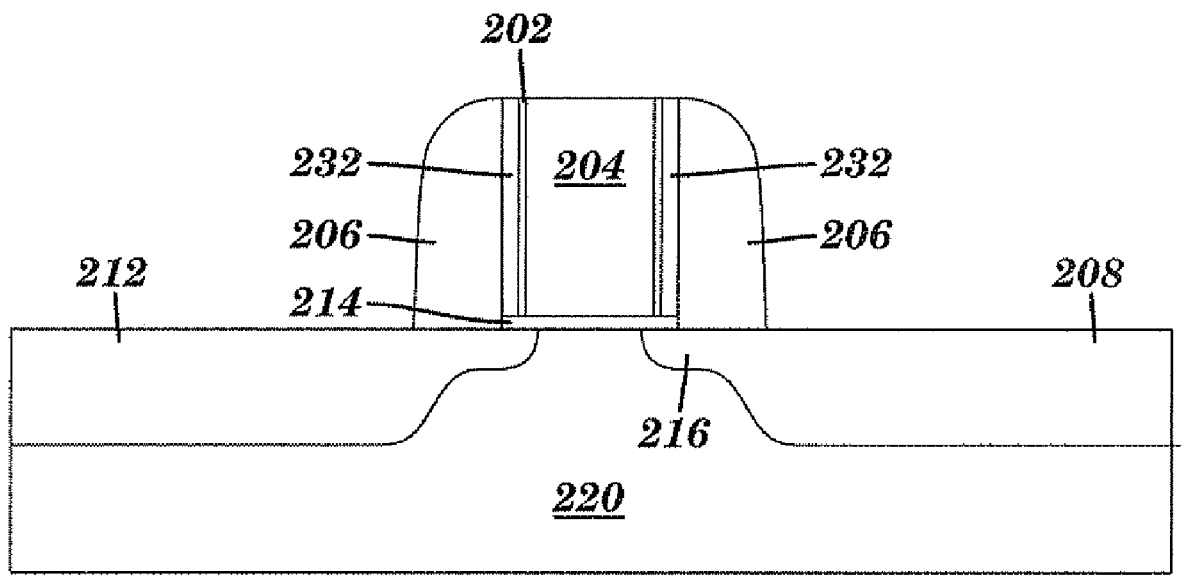
Figure 22B:
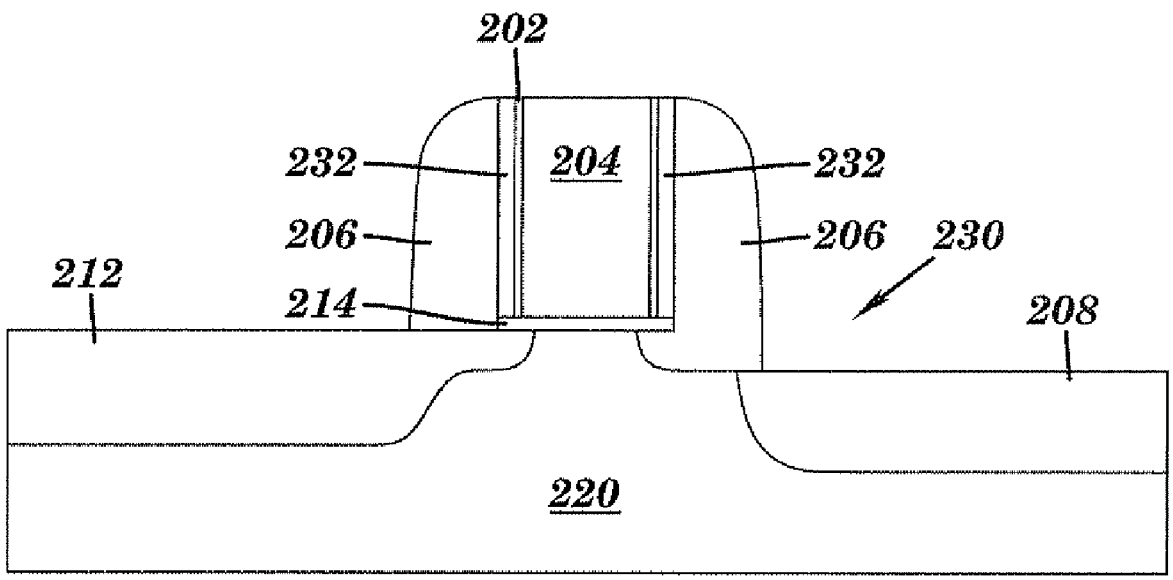

FIGS. 20(*a*) and 20(*b*) illustrate a comparison of the effects of the extension/halo implant steps, removal of the gate oxide layer and selective etch. In FIG. 20(*a*), both the source and drain extension/halo regions remain intact after the selective etch, since this section of the drain side of the device was not doped with germanium. However, in FIG. 20(*b*), it can be seen that the selective etch of the germanium doped silicon on the drain side removes the drain extension and halo implant regions in these sections along the width of the device (including beneath the gate 204), thus creating the recess 230 described above. When the source/drain spacers 206 are then formed as shown in FIGS. 21(*a*) and 21(*b*), the nitride spacer material corresponding to locations over the recessed areas 230 fills the voids beneath the drain side of the gate 204, as particularly shown in FIG. 21(*b*), thereby preventing a subsequent overlap of a drain extension with the gate 204. Due to the recessed drain regions, the contribution of out-fringing capacitance to overlap capacitance is reduced as well. This can further reduce total overlap capacitance between the gate and the drain.

The source and drain ion implantations are then carried out, wherein it will also be noted from FIG. 21(*b*) that due to the recessed area 230, the drain side dopants are located at a lower point in the substrate with respect to the source side dopants. The protective a nitride capping layer 236 will also be removed in order to dope the polysilicon gate layer 204. Finally, in FIGS. 22(*a*) and 22(*b*), a diffusion anneal of the device defines the contours of the source and drain regions. Again, in FIG. 22(*a*), the cross sectional view resembles a more conventional MOSFET device, whereas in FIG. 22(*b*), the drain regions sits lower than the source regions, and without a drain extension to overlap with the gate 204.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a field effect transistor (FET) device, the method comprising:
   forming a gate conductor over a semiconductor substrate;
   forming a source region, said source region having a source extension that overlaps and extends under said gate conductor; and
   forming a drain region, said drain region having a drain extension that overlaps and extends under said gate conductor at selected locations along the width of said gate;
   said drain region further comprising a plurality of recessed areas formed by performing a selective etch of said semiconductor substrate, said plurality of recessed areas corresponding to areas where said drain extension does not overlap and extend under said gate conductor, wherein said plurality of recessed areas is formed only in said drain region; and
   implanting portions of said semiconductor substrate corresponding to said plurality of recessed areas with a neutral dopant selected to increase the etch rate of doped areas of said substrate with respect to undoped areas of said substrate.

2. The method of claim 1, wherein said semiconductor substrate comprises silicon and said neutral dopant comprises germanium.

3. The method of claim 2, wherein said selective etch removes areas of said substrate containing said neutral dopant.

4. The method of claim 1, further comprising:
   implanting the FET device with source/drain extension and halo implants;
   removing a gate oxide layer over said source and drain regions; and
   removing areas of said substrate containing said neutral dopant.

5. The method of claim 4, further comprising:
   forming a spacer material adjacent sidewalls of said gate conductor;
   implanting said source/drain regions; and
   annealing the FET device.

6. The method of claim 5, wherein said spacer material is also formed beneath said gate conductor at locations corresponding to said plurality of recessed areas.

* * * * *